(12) United States Patent
Herrmann et al.

(10) Patent No.: US 10,723,293 B2
(45) Date of Patent: *Jul. 28, 2020

(54) ELECTRONIC DEVICE AND REAR-VIEW DEVICE

(71) Applicant: SMR Patents S.à.r.l., Luxembourg (LU)

(72) Inventors: Andreas Herrmann, Stuttgart (DE); Artem Rudi, Stuttgart (DE)

(73) Assignee: SMR Patents S.à.r.l., Luxembourg (LU)

( * ) Notice: Subject to any disclaimer, the term of this patent is extended or adjusted under 35 U.S.C. 154(b) by 0 days.

This patent is subject to a terminal disclaimer.

(21) Appl. No.: 16/273,664

(22) Filed: Feb. 12, 2019

(65) Prior Publication Data

US 2019/0168691 A1    Jun. 6, 2019

Related U.S. Application Data

(63) Continuation-in-part of application No. 15/256,532, filed on Sep. 3, 2016, now Pat. No. 10,202,079.

(30) Foreign Application Priority Data

Sep. 3, 2015 (EP) ..................................... 15183748

(51) Int. Cl.
*B60R 16/023* (2006.01)
*H05K 5/00* (2006.01)
(Continued)

(52) U.S. Cl.
CPC .............. *B60R 16/023* (2013.01); *B60R 1/00* (2013.01); *B60R 16/0239* (2013.01);
(Continued)

(58) Field of Classification Search
CPC .............. B60R 16/0239; B60R 1/1207; H05K 1/0284; H05K 2201/0999; H05K 5/0047;
(Continued)

(56) References Cited

U.S. PATENT DOCUMENTS 7,053,322 B2    5/2006 Helmstetter et al.
7,434,949 B2 *  10/2008 Imai ..................... H01H 13/023
                                                    362/23.21
(Continued)

FOREIGN PATENT DOCUMENTS

DE    102007037483 A1    2/2009
DE    102012108480 B3    2/2014
(Continued)

OTHER PUBLICATIONS

European Search Report dated May 10, 2016 of EP application No. 15183748.

*Primary Examiner* — Peggy A Neils
(74) *Attorney, Agent, or Firm* — Jones Day

(57) ABSTRACT

An electronic device of a vehicle part of a motor vehicle includes at least one housing having at least one base surface of the vehicle part and a cover piece attached on the base surface, which in the attached state delimits an almost completely closed cavity, at least one first retaining means of a first surface of the vehicle part through which the housing is fixed in or on the vehicle part, and at least one electronic module including at least one conductor unit and at least one contact means connected with the conductor unit.

21 Claims, 11 Drawing Sheets

(51) Int. Cl.
  *H05K 1/02* (2006.01)
  *B60R 1/00* (2006.01)
  *B60R 19/48* (2006.01)
  *H05K 3/10* (2006.01)
  *H05K 3/00* (2006.01)

(52) U.S. Cl.
  CPC ......... *B60R 19/483* (2013.01); *H05K 1/0284* (2013.01); *H05K 5/0047* (2013.01); *H05K 5/0073* (2013.01); *H05K 3/0014* (2013.01); *H05K 3/101* (2013.01); *H05K 3/105* (2013.01); *H05K 2201/0999* (2013.01)

(58) Field of Classification Search
  CPC ....... H05K 5/0073; H05K 2201/09118; H05K 3/101; B60Q 1/2665; B60Q 1/2669; B60Q 3/14; B60Q 3/267; F21V 19/003; F21V 23/002; F21V 23/009
  See application file for complete search history.

(56) References Cited

U.S. PATENT DOCUMENTS

| | | | |
|---|---|---|---|
| 7,559,120 B2 * | 7/2009 | Fujiwara | B29C 45/14639 16/412 |
| 10,202,079 B2 * | 2/2019 | Herrmann | H05K 1/0284 |
| 2004/0184278 A1 * | 9/2004 | Cheron | B60Q 1/2696 362/505 |
| 2014/0070068 A1 | 3/2014 | Schmierer | |
| 2015/0353005 A1 * | 12/2015 | Hodgson | B60Q 3/51 345/156 |

FOREIGN PATENT DOCUMENTS

| | | |
|---|---|---|
| EP | 1205350 A2 | 5/2002 |
| EP | 1623885 A2 | 2/2006 |
| EP | 1623885 A3 | 7/2007 |

\* cited by examiner

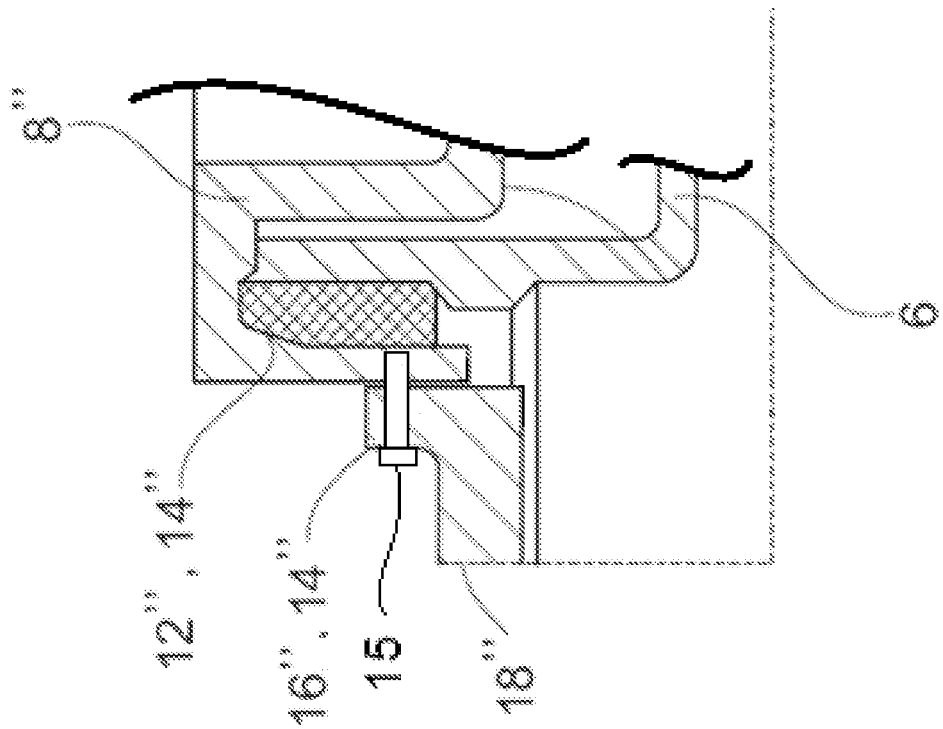
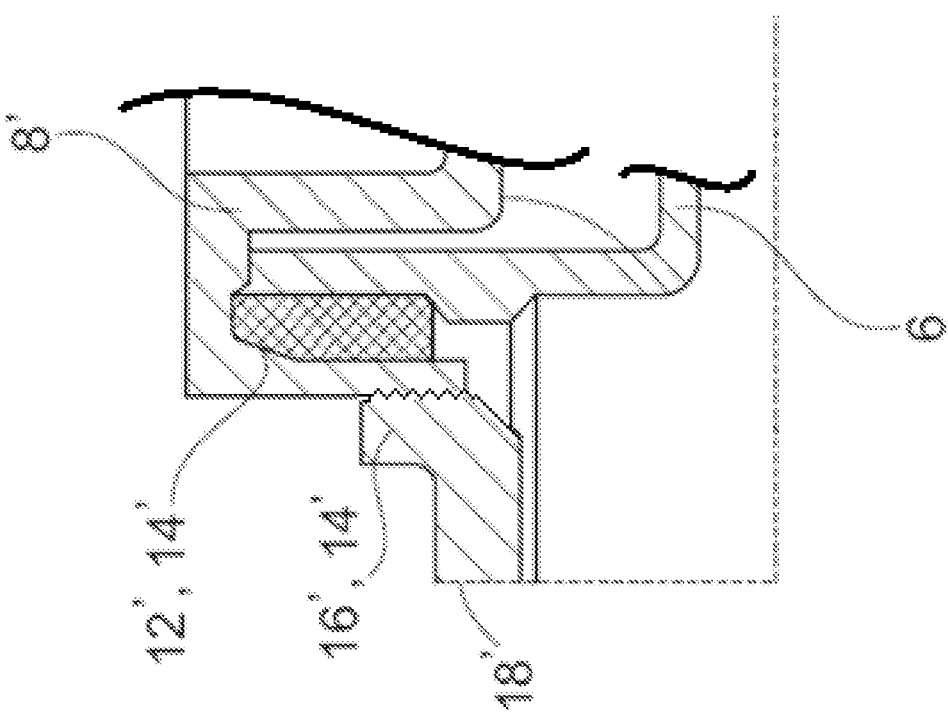

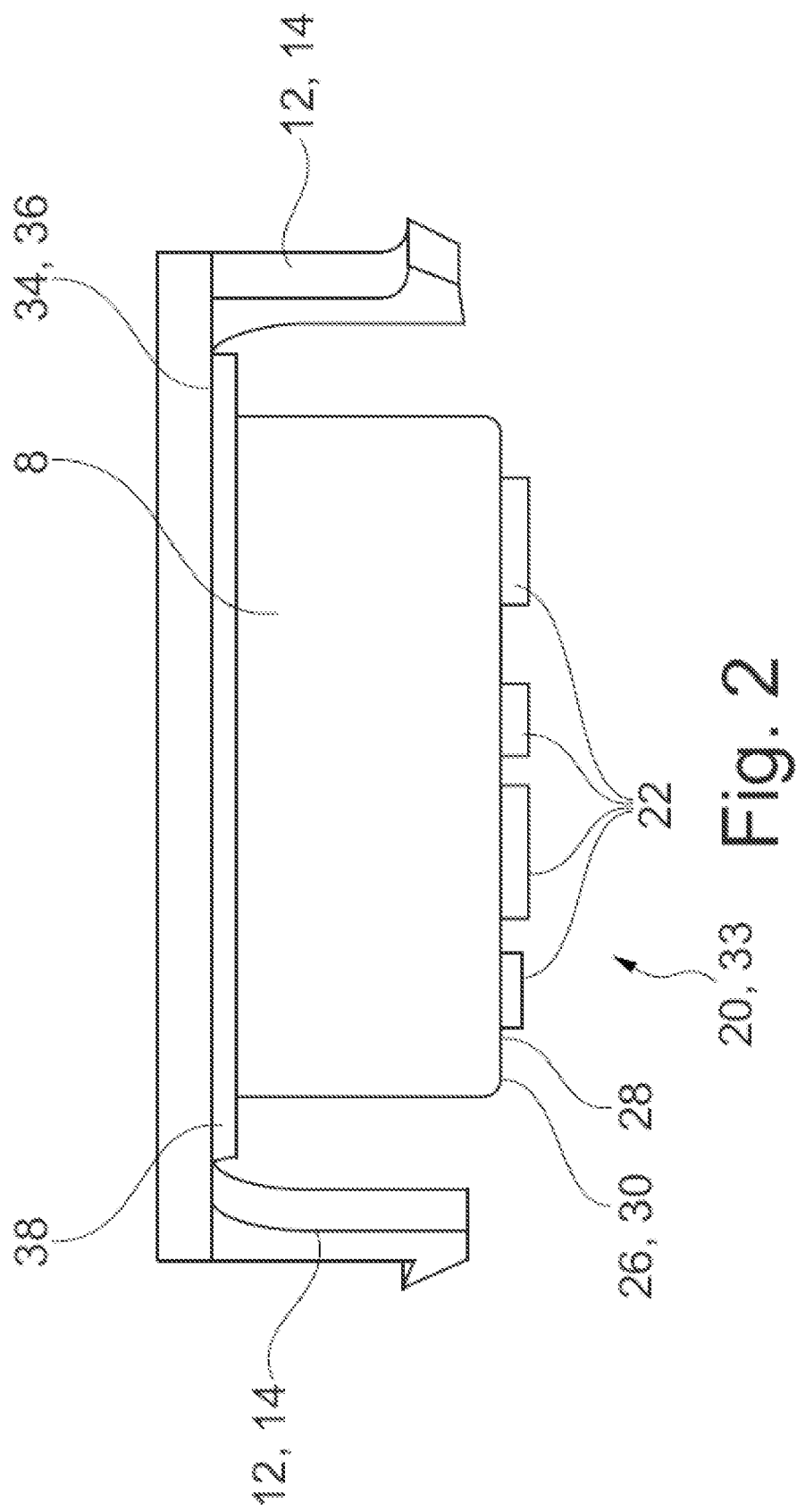

ELECTRONIC DEVICE AND REAR-VIEW DEVICE

CROSS-REFERENCE TO RELATED APPLICATIONS

This application is a continuation-in-part of U.S. patent application Ser. No. 15/256,532, filed Sep. 3, 2016, which claims priority from European Patent Application No. 15183748.1, filed Sep. 3, 2015, the disclosure of each of which is incorporated herein by reference for all purposes.

TECHNICAL FIELD

The present disclosure relates in general to motor vehicle electronic device. In particular, an electronic device, configured for use in a vehicle part, and a vehicle part including such an electronic device.

BACKGROUND

Electronic devices are known in vehicle parts, such as exterior mirrors, of motor vehicles. These in each case comprise an electronic module, which is arranged in a housing device and fixed in a vehicle part, for example an exterior mirror, a vehicle bumper, a center console, an instrument panel, a door trim part, or another vehicle part. Because of the high number of electrical loads, such as indicator lamps, blind-spot displays, proximity light or what are known as logo lamps, or other vehicle light nodules or sensor modules, each electrical load is assigned with its own electronic module with its own housing device. Each of the electronic modules consists of a conductor unit, which are fixed as separate components in the respective housing device.

Because of the high number of electrical loads and the correspondingly high number of electronic modules functionally assigned to the electrical loads, in the known vehicle parts a correspondingly high amount of space has to be allowed for, to arrange the high number of electronic devices. Furthermore, assembly of the individual electronic modules has proven to be time-consuming and maintenance is difficult.

From EP 1 205350 A2 a steering column switch is known, in particular for motor vehicles, having a base housing with floor and side walls, a housing cover, with several switch units and conducting tracks that contact the switch units. Here the conducting tracks are designed as a single- or multi-part contact grid. In addition, the contact grid extends over sections of at least one side wall and the floor of the base housing.

A compact multifunctional electronic assembly with a circuit substrate is described in DE 102007037483 A1. Here on the outer surface of the circuit substrate a plurality of electronic components, in particular switching elements, is arranged. The connection of the components with each other and with a contact device is carried out via conductor tracks and contact surfaces, which are arranged running multi-dimensionally in surface areas of the circuit carrier. The circuit carrier is designed as an injection molded part.

EP 1623885 A2 discloses an airbag module for use in a vehicle occupant restraint system having a generator carrier made of plastic, with a printed circuit formed on the generator carrier by metal precipitation, wherein the printed circuit interacts with a switching element arranged on a section of the generator carrier to trigger an electric functional element.

SUMMARY OF THE INVENTION

An electronic device of a vehicle part of a motor vehicle includes at least one housing comprising at least one base surface of the vehicle part and a cover piece attached on the base surface, which in the attached state delimits an almost completely closed cavity, at least one first retaining means of a first surface of the vehicle part through which the housing is fixed in or on the vehicle part, and at least one electronic module comprising at least one conductor unit and at least one contact means connected with the conductor unit, wherein the at least one conductor unit is arranged on a surface of at least one of the base surface of the vehicle part and the cover piece which is turned towards the cavity, and comprises at least one carrier and at least one conductor track applied directly to the carrier, the contact means extends through at least one of the cover piece and the base surface of the vehicle part with at least one protruding contact section being accessible externally, the at least one carrier of the at least one conductor unit is formed at least in sections by a functional surface of at least one of the cover piece and the base surface of the vehicle part adjacent to the cavity and turned towards the cavity, and at least one of the cover piece and the base surface of the vehicle part with the at least one first retaining means of the first surface of the vehicle part form or forms a common component.

The vehicle part may include at least one of a bumper unit, a door trim part, an instrument panel retainer, and a center console.

The at least one carrier may be formed entirely by the functional surface of at least one of the base surface of the vehicle part and the cover piece.

The conductor track may be applied directly to the carrier and the functional surface may be applied by at least one of injection molding Molded Interconnect Devices (MID), a conductive foil Inmold-Labeling (IML), and Laser Direct Structuring (LDS) directly to the carrier and the functional surface.

The electronic module may include a plurality of conductor units or the electronic module forms a common control unit for a plurality of electrical loads of the vehicle part, wherein each electrical load is or can be functionally assigned with at least one conductor unit, and at least one main conductor unit may include a driver circuit via which the conductor units functionally assigned to the electrical loads are individually or jointly controllable.

At least one of the common component of the at least one first retaining means and of the cover piece or of the base surface of the vehicle part may be an injection molded part, and the cover piece with the at least one first retaining means of the first surface of the vehicle part may be formed as a common component.

At least one of the housing may be fixed by the first retaining means, detachably, by means of a rear grip in or on the vehicle part, and the first retaining means may include at least one of an externally threaded section on the cover piece or on the base surface of the vehicle part, a latching element, such as clips or a bayonet fitting, and a screw or bolt element.

The first retaining means may be fixed with a first end to an end of the cover piece or the base surface of the vehicle part opposite of the functional surface of the cover piece or base surface and may be arranged with a second end extending in the direction of the functional surface, and the first retaining means may be designed to extend without overlapping to the plane of the functional surface and the second end has a distance from the plane of the functional surface.

The first surface of the vehicle part may include a second retaining means fixed in or on the vehicle part, and the second retaining means may include at least one of an internally threaded section which is able to interact with the first retaining means designed as externally threaded section, a rear-gripping receiving means interacting with the first retaining means designed as a latching element, and an accommodation for the first retaining means designed as a screw or bolt element.

At least one of the at least one protruding and externally accessible contact section of the at least one contact means may include at least one pin, in particular a plurality of pins, via which the electronic module can be or is connected with at least one of a power source and an electrical load, and the electronic device may include at least one energy storage arranged in the cavity of the housing device functional assigned to the electronic module for storing and releasing electrical energy.

The cover piece and the base surface of the vehicle part in each case may include a cylindrical section, by which, in response to being joined, the cover piece and the base surface of the vehicle part can be slid into each other concentrically and telescopically, and the cover piece may include an edge section protruding radially with regard to the cylindrical section and extending fully around the outer surface of the cover piece, which, in response to the cover piece and the base surface of the vehicle part being joined, forms an end stop.

The at least one of the cover piece and the base piece may have a pot-like design, and, at least the cover piece may include an extensive base plate adjacent to the cylindrical section, which runs transversally or inclined to the axis of the cylindrical section, and on its side turned towards the base surface of the vehicle part the functional surface is arranged and on its side turned away from the base surface of the vehicle part and surrounded by the cylindrical section the contact section of the contact means is arranged.

At least one sealant may be arranged between the cover piece and the base surface of the vehicle part between the base surface and an edge section of the cover piece through which the cavity of the housing can be sealed with respect to a gap existing between the cover piece and the base surface.

The vehicle part may include a second surface and a second retaining means, the base surface of the housing may include an element of a component configured as a one-piece injection molded part of at least one of the second surface and the second retaining means of the vehicle part.

At least one of the base surface of the vehicle part, the cover piece, the first retaining means, and a second retaining means may include a plastic.

The electronic device may be designed as a lighting module.

The at least one base surface of the vehicle part may include a floor surface of the vehicle part.

A bumper unit for a motor vehicle includes the at least one electronic device.

A door trim unit for a motor vehicle includes the at least one electronic device.

An instrument panel retainer for a motor vehicle includes the at least one electronic device.

A center console for a motor vehicle includes the at least one electronic device.

In another aspect, a rear-view device for a motor vehicle by an electronic device is configured for use in a rear-view device for a motor vehicle, with at least one housing device, including at least one floor piece and a cover piece arranged or that can be arranged on the floor piece, which in the joined state delimit an at least almost completely closed cavity, with at least one first retaining means of a retaining unit, through which the housing device can be or is fixed in or on the rear-view device, and with at least one electronic module, including at least one conductor unit and at least one contact means connected with the conductor unit, wherein on a surface of the floor piece and/or cover piece turned towards the cavity the conductor unit is arranged, including at least one carrier and at least one conductor track applied directly to the carrier, the contact means extending through the cover piece and/or through the floor piece with at least one protruding contact section is accessible externally, the at least one carrier of the at least one conductor unit is formed at least in sections by a functional surface of the floor piece and/or the cover piece adjacent to the cavity and turned towards the cavity, and the cover piece and/or floor piece with the at least one first retaining means of the retaining unit form or forms a common component.

In that at least one carrier of a conductor unit is formed at least in sections by a functional surface of the floor piece and/or the cover piece, the electronic device has fewer components and can be compactly designed. This also reduces the assembly effort.

Apart from the conductor tracks the conductor unit can include further electronic components such as integrated circuits (IC), capacitors, resistors and similar. These can also be arranged on the carrier, in particular on the functional surface of the floor piece and/or the cover piece.

The conductor unit can have a board-like design, without including a separate component. In such a case the conductor unit can be formed entirely of the functional surface. It is conceivable that components of the conductor unit are attachable as separate components to the functional surface, without the conductor unit as a whole being formed by the separate component.

In a further development of the abovementioned exemplary embodiment it has proven advantageous if at least one carrier of the at least one carrier is formed entirely by the functional surface of the floor piece and/or cover piece. In such a case a carrier of the electronic module formed as a separate component can be fully dispensed with, if the functional surface of the floor piece or the cover piece takes over the function of the carrier previously formed as a separate component.

The conductor track applied to the carrier, in particular to the functional surface, can essentially be correspondingly realized according to the conductor units formed as separate components. The electronic device however can have a compact design, if the conductor track applied directly to the carrier, in particular the functional surface, is applied by injection molding (Molded Interconnect Devices [MID]), by a conductive foil (Inmold-Labeling [IML]) and/or by Laser Direct Structuring [LDS] directly to the carrier, in particular the functional surface.

Furthermore, the number of housing devices and electronic modules arranged therein can be reduced if the electronic module includes a plurality of conductor units and/or if the electronic module forms a common control unit for a plurality of electrical loads of the rear-view device, wherein each electrical load is or can be functionally assigned with at least one conductor unit and wherein in particular at least one main conductor unit includes a driver circuit via which the conductor units functionally assigned to the electrical loads are individually and/or jointly controllable.

This allows to combine the electronic modules previously operated separately and independently of one another in a common electronic module. In this way the number of housing devices to be allowed for can also be reduced to a single housing device, in which the common electronic module is arranged. This allows the rear-view device to have a compact design with fewer components, since less space has to be allowed for to accommodate the electronic device.

It has furthermore proven advantageous if the at least one retaining unit includes at least one first retaining means, which together with the cover piece and/or the floor piece forms a common component, in particular an injection molded part.

If the first retaining means of the retaining unit, with the cover piece or the floor piece, forms a common component, in particular an injection-molded part, the electronic device can be designed with less components and the ease of assembly further increased.

It has further proven advantageous if the housing device can be or is fixed by the retaining unit, in particular by the first retaining means, detachably, in particular by means of a rear grip, in or on the rear-view device and/or if the first retaining means includes an externally threaded section on the cover piece or on the floor piece, a latching element, such as clips or a bayonet fitting, and/or a screw or bolt element.

In a further development of the abovementioned exemplary embodiment it has proven advantageous if the retaining unit includes a second retaining means fixed in or on the rear-view device, in particular fixed to a retaining plate of the rear-view device, including an internally threaded section, which is able to interact with the first retaining means designed as externally threaded section, including a rear-gripping receiving means interacting with the first retaining means designed as a latching element and/or an accommodation for the first retaining means designed as a screw or bolt element.

When manufacturing the electronic device individual components of the electronic module are arranged mechanically on the functional surface of the cover piece and/or of the floor piece. Here the tool used for assembling the components of the electronic module runs parallel to a plane of the functional surface of the cover piece and/or of the floor piece, said plane being spanned by vectors in x and y direction, wherein when joining individual components transversally to this plane, the tool runs along a z direction. In order to keep the movement in z direction low, it has proven advantageous if the first retaining means is fixed with a first end to an end of the cover piece or the floor piece opposite of the functional surface of the cover piece or the floor piece and is arranged with a second end extending in the direction of the functional surface, wherein the first retaining means is designed to extend without overlapping to the plane of the functional surface and the second end has a distance from the plane of the functional surface.

This has proven particularly advantageous if the first retaining means is designed as a clip. In such a case the retaining means designed as clips extend in z direction, but do not protrude beyond the functional surface. This means that wide assembly paths of the tool used for assembly, which would be necessary for retaining means protruding beyond the functional surface, can be prevented in order not to damage the retaining means.

If the first retaining means, for example, includes an externally threaded section on the cover piece or on the floor piece of the housing device and the second retaining means includes an internally threaded section, the electronic device can be readily fixedly screwed into the rear-view device without tooling.

If the first retaining means includes a latching element and the second retaining means a receiving means interacting with the latching means, the electronic device can be assembled simply by clipping the electronic device in the rear-view device. Furthermore, in such a case the maintenance of the electronic device is also simplified, since the electronic device can be mounted on the rear-view device without tooling or removed without tooling by releasing the clip connection.

The electronic device can easily be connected with a power source, if the at least one protruding and externally accessible contact section of the at least one contact means includes at least one pin, in particular a plurality of pins, via which the electronic module can be or is connected with at least one power source and/or with at least one electrical load.

Furthermore, in one exemplary embodiment of the electronic device it has proven advantageous if the electronic device includes at least one energy storage arranged in the cavity of the housing device and functional assigned in the electronic module, in particular for storing and releasing electrical energy.

In such a case it is for example possible to hold an energy reserve independent of the power source, in order for example to balance peaks or in order in the event of a power supply failure to keep a reserve of energy available in order, for example, to maintain warning light functions for at least a limited time.

In order to simplify joining of the cover piece to the floor piece, in particular in order to reduce the danger of tilting when joining the cover piece to the floor piece, it has proven advantageous if the cover piece and the floor piece in each case include a cylindrical section, by which, when they are being joined, they can be slid into each other, in particular concentrically, telescopically, wherein the cover piece includes an edge section protruding radially with regard to the cylindrical section and extending fully around the outer surface of the cover piece, which when the cover piece and the floor piece are joined forms an end stop.

As a result of the round shape further an even distribution of the clamping force of the retaining unit is achieved and through the provision of a uniform, round, contact area a good sealing surface is made available.

In a further development of the last-mentioned embodiment it has proven especially advantageous if the cover piece and/or the floor piece has/have a pot-like design, wherein at least the cover piece includes an extensive base plate adjacent to the cylindrical section, which runs transversally or inclined to the axis of the cylindrical section, and on its side turned towards the floor piece the functional surface is arranged and on its side turned away from the floor piece and surrounded by the cylindrical section the contact section of the contact means is arranged.

As a result of the floor piece and the cover piece each being designed with a cylindrical section, which when they are being joined can be concentrically and telescopically slid into each other, a uniform contact area is made available. In this way a gap existing between the floor piece and the cover piece can be kept small. It has further proven particularly advantageous if the electronic device includes at least one sealant arranged between the cover piece and the floor piece, in particular between the floor piece and the edge section of the cover piece, through which the cavity of the housing device can be sealed with respect to a gap existing between cover piece and floor piece.

In this way an ingress of moisture and dirt into the cavity is prevented, as a result of which the danger of a contamination of, in particular damage to, the electronic module is reduced.

The electronic device can be particularly easily assembled and disassembled, for maintenance purposes, if the floor piece of the housing device includes a one-piece element of a component, in particular a one-piece injection-molded part, such as the retaining plate, of the rear-view device. In such a case the individual components of the electronic device can be pre-assembled so that for final assembly just the cover piece, to which the electronic module, the first retaining means of the retaining unit as well as the sealant are fixed, is screwed or glued to the floor piece. In this way the previous plurality of individual electronic modules with the previous plurality of housing devices, which in each case were formed by a plurality of separate components, can be assembled and disassembled in a single movement.

The electronic device can furthermore be manufactured with reduced weight and economically, if the floor piece, the cover piece, the first retaining means and/or the second retaining means include a plastic.

The electronic device can be designed as a lighting module, in particular for a perimeter light of the rear-view device.

The rear-view device can contain at least one reflective element and/or at least one camera.

The electronic device and the rear-view device have proven to be advantageous in a number of respects:

Because a floor piece and/or the cover piece include a functional surface turned towards the cavity, which at least partly forms the carrier of the conductor unit, the electronic device can be designed with a reduced number of components.

Because in the housing device a plurality of conductor units can be arranged, which form a common electronic module, the previous plurality of electronic devices can be arranged in a common electronic device, in particular in a common housing device. In this way the space that has to be allowed for in the rear-view device is reduced.

BRIEF DESCRIPTION OF THE DRAWINGS

The foregoing summary, as well as the following detailed description, will be better understood when read in conjunction with the appended drawings. For the purpose of illustration, certain examples of the present disclosure are shown in the drawings. It should be understood, however, that the present disclosure is not limited to the precise arrangements and instrumentalities shown. The accompanying drawings, which are incorporated in and constitute a part of this specification, illustrate an implementation of system, apparatuses, and methods consistent with the present disclosure and, together with the detailed description, serve to explain advantages and principles consistent with the present disclosure, wherein:

FIG. 1B is an enlarged schematic illustration of another example of the retaining unit of FIG. 1A;

FIG. 1C is an enlarged schematic illustration of yet another example of the retaining unit of FIG. 1A;

FIG. 2 is a side view of a cover piece with a first retaining means and an electronic module according to FIG. 1A;

DETAILED DESCRIPTION OF THE PREFERRED EMBODIMENT

Figure 1A:
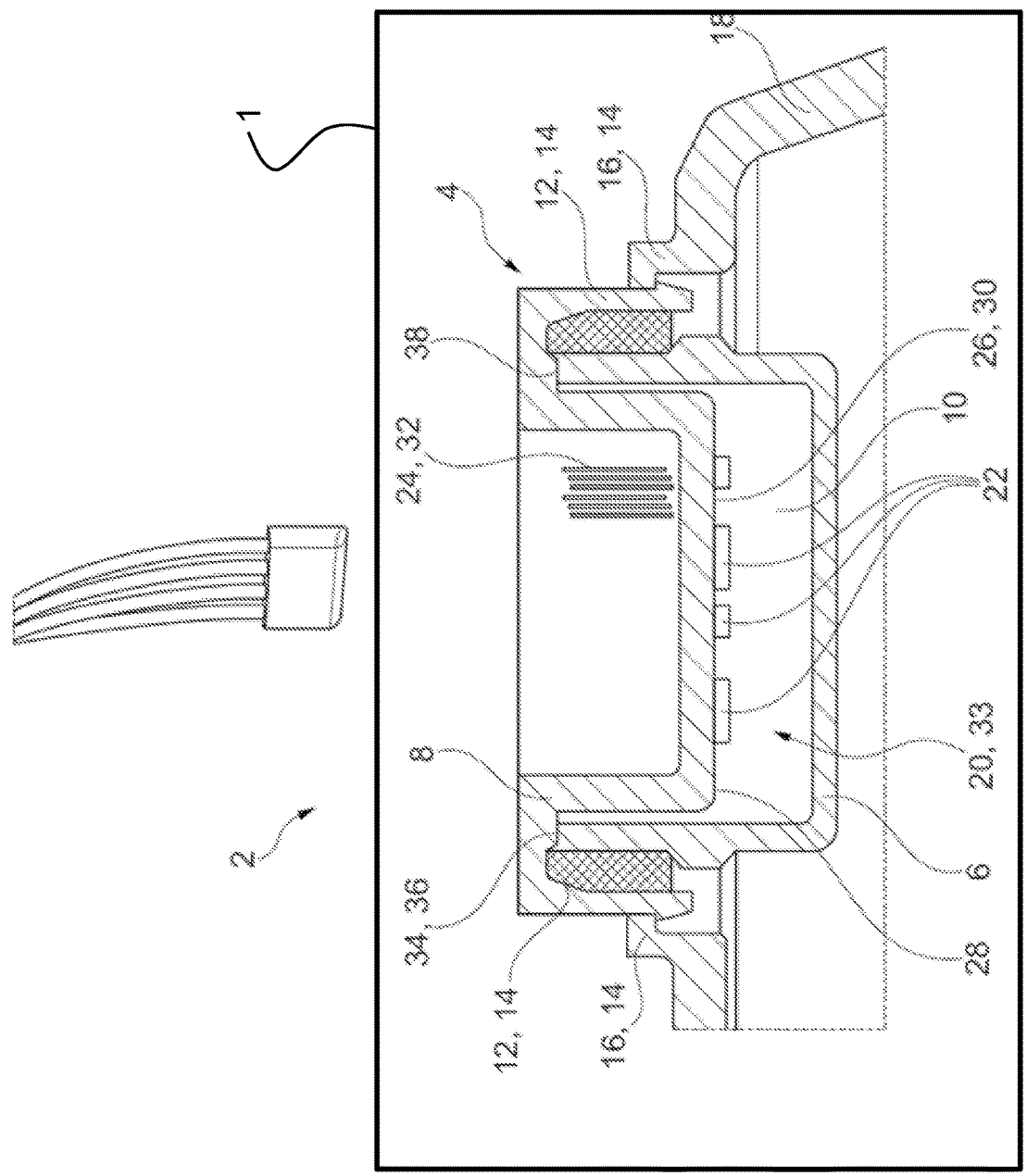
FIG. 1A is a schematic illustration of a rear-view device showing a sectional side view of an example of an electronic device.

It is to be understood that the disclosure is not limited in its application to the details of construction and to the arrangements of the components set forth in the following description or illustrated in the drawings. The Figures and written description are provided to teach those skilled in the art to make and use the inventions for which patent protection is sought. The disclosure is capable of other embodiments and of being practiced and carried out in various ways. Those skilled in the art will appreciate that not all features of a commercial embodiment are shown for the sake of clarity and understanding. Those skilled in the art will also appreciate that the development of an actual commercial embodiment incorporating aspects of the present disclosure may require numerous implementation-specific decisions to achieve the developer's ultimate goal for the commercial embodiment.

In addition, it is to be understood that the phraseology and terminology employed herein are for the purpose of describing the present disclosure and should not be regarded as limiting. For example, the use of a singular term, such as, "a" is not intended as limiting of the number of items. Also, the use of relational terms, such as but not limited to, "top," "bottom," "left," "right," "upper," "lower," "down," "up," "side," are used in the description for clarity in specific reference to the Figures and are not intended to limit the scope of the present disclosure. Further, it should be understood that any one of the features may be used separately or in combination with other features. Other systems, methods, features, and advantages will be or become apparent to those skilled in the art upon examination of the Figures and the description. The term "driver" is used throughout this disclosure but is not limited to a person who is operating or controlling the vehicle; it may refer to any vehicle occupant, person, passenger, or user inside the vehicle, or, in certain circumstances, a person who is outside the vehicle but controlling the vehicle or interested in movement of the vehicle. It is intended that all such additional systems, methods, features, and advantages be included within this description, and be within the scope of the present disclosure.

Referring now to the drawings, there is illustrated in FIGS. 1A-3 an electronic device for a rear-view device 1 for a motor vehicle given reference numeral 2 in its entirety. The electronic device 2 includes a housing device 4, including a floor piece 6 and cover piece 8 arranged on the floor piece 6. The floor piece 6 and the cover piece 8 delimit a cavity 10.

In the exemplary embodiment shown in the figures on the cover piece 8 a first retaining means 12 of a retaining unit 14 is fixed. The exemplary embodiment shown in the figures includes three first retaining means 12 which engage with correspondingly designed second retaining means 16, arranged on a retaining plate 18 of the rear-view device, in order to create a rear grip. As shown in FIG. 1A, the retaining unit 14 is illustrated as engaging clips or bayonet fittings. FIG. 1B illustrates an alternative retaining unit 14' including mating threaded surfaces 12', 16' of a cover 8' and a retaining plate 18', respectively. FIG. 1C illustrates another embodiment of a retaining unit 14" including a bolt or screw fastener 15 in conjunction with a threaded hole 12" and a through hole 16".

Furthermore, the electronic device 2 includes an electronic module 20, including a conductor unit 22 and a contact means 24. The at least one conductor unit 22 is arranged on a surface of the cover piece 8 turned towards the cavity 10. The one conductor unit 22 includes a carrier 26 and conductor tracks 28 applied directly to the carrier 26. The carrier 26 is formed by a functional surface 30 of the cover piece 8. The functional surface 30 is an element of the cover piece 8 on which the conductor tracks 28 have been applied to, for example by means of injection molding, by a conductive foil or by laser direct structuring.

The contact means 24 is connected on one side with the conductor unit 22 and extends through the cover piece 8 so that it is accessible with a contact section 32 from outside.

In the exemplary embodiment shown in the figures the electronic module 20 includes a plurality of conductor units 22, forming a common control unit 33 for a plurality of electrical loads of the rear-view device. Here the contact section 32 firstly serves to connect the individual electrical loads to the common electronic module 20 and secondly to establish a connection to a power source, which is for example arranged in the motor vehicle.

In the exemplary embodiment shown in the figures both the cover piece 8 and the floor piece 6 include a cylindrical section, by which, when they are being joined, they are slid into each other concentrically and telescopically. Here the cover piece 8 has an edge section 34 protruding radially to the cylindrical section and fully surrounding the outer surface of the cover piece 8. When the cover piece 8 is joined this forms an end stop 36 for the floor piece 6. In order to reduce the danger of an ingress of dirt and moisture into the cavity 10 of the housing device 4, between the cover piece 8 and floor piece 6, in particular between the edge section 34 of the cover piece 8 and the floor piece 6, a sealant 38 is provided.

Figure 3:
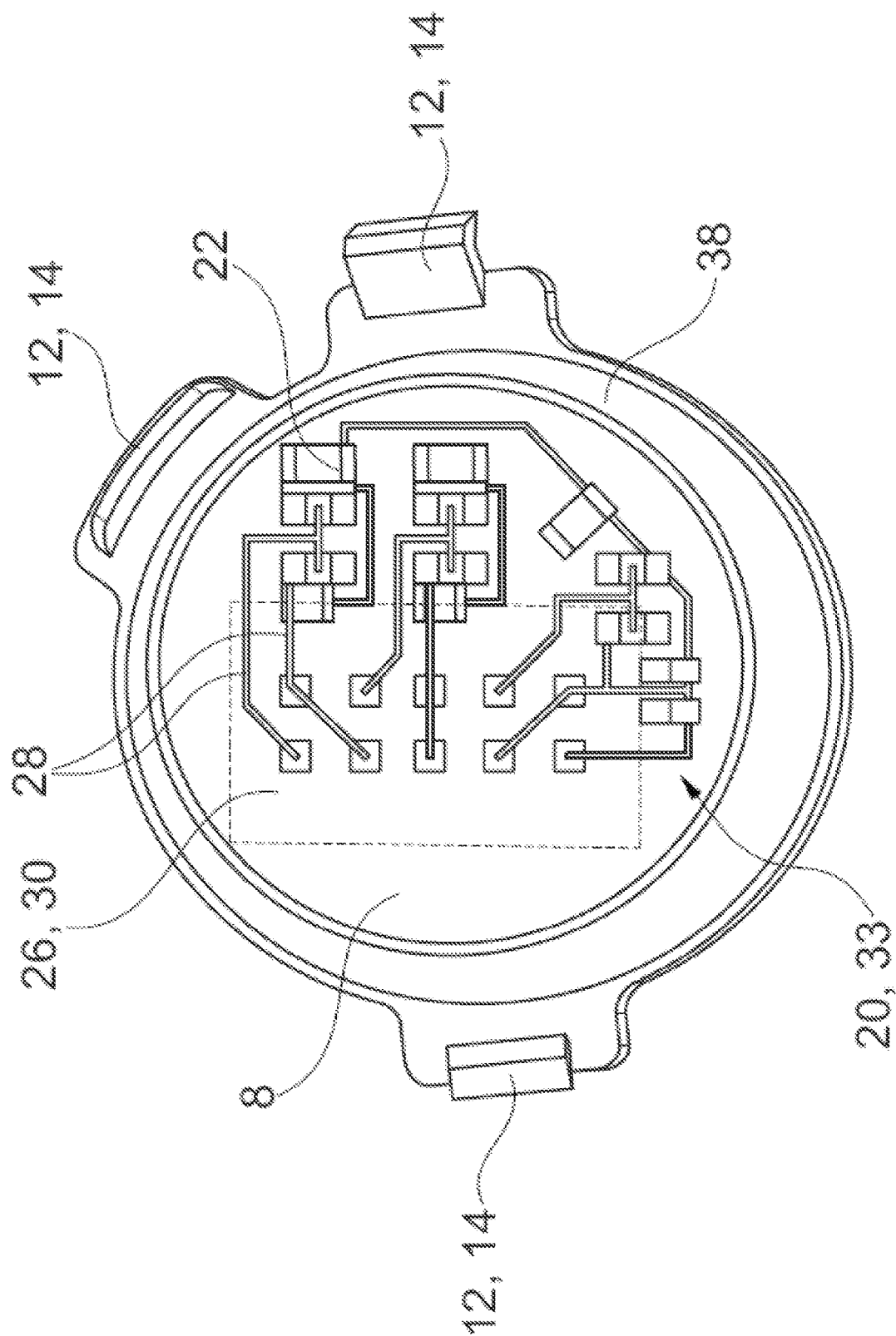
FIG. 3 is a bottom view of the electronic device according to FIG. 2.

FIGS. 2 and 3 show a side view and a bottom view, respectively, of the cover piece 8 shown in FIG. 1A. The first retaining means 12 of the retaining unit 14 and the cover piece 8 include a common component.

In the following the assembly and disassembly, respectively, of the electronic device 2 is outlined:

In a retaining plate 18 of the rear-view device the floor piece 6 and the second retaining means 16 of the retaining unit 14 are fixed. In the exemplary embodiment shown in FIG. 1 retaining plate 18, second retaining means 16 of the retaining unit 14, and floor piece 6, include a common component, in particular a common injection molded component.

On the cover piece 8 the first retaining means 12 of the retaining unit 14 are fixed and in the exemplary embodiment shown in FIGS. 1A to 3 these include a common component with the cover piece 8, in particular a common injection molded component. Furthermore, on the cover piece 8 the sealant 38 and the electronic module with its components of conductor unit 22, carrier 26, formed by the functional surface 30 on the cover piece 8, and the conductors tracks 28 arranged on the functional surface 30 and the contact means 24 are fixed. For assembly the cover piece 8 is introduced with a cylindrical section axially into the floor piece 6. Upon reaching the joined end position a further movement of the cover piece 8 in the direction of the floor piece 6 is limited by the edge section 34 of the cover piece 8, which forms the end stop 36, and by the sealant 38 arranged in the edge section 34. In this arrangement the first retaining means 12 of the retaining unit 14 interlock with the second retaining means 16 of the retaining unit 14. In this way the cover piece 8 is fixed against moving backwards.

In order to achieve operational readiness, the electrical loads and the power source can now be connected via the contact section 32 of the contact means 24 with the electronic device 2.

In order to disassemble the electronic device 2 the first retaining means 12 of the retaining unit 14 are released from their interlock, as a result of which the cover piece 8 is now free to move against the assembly direction. The cover piece 8 can now be removed against the assembly direction from the floor piece 6.

Figure 4A:
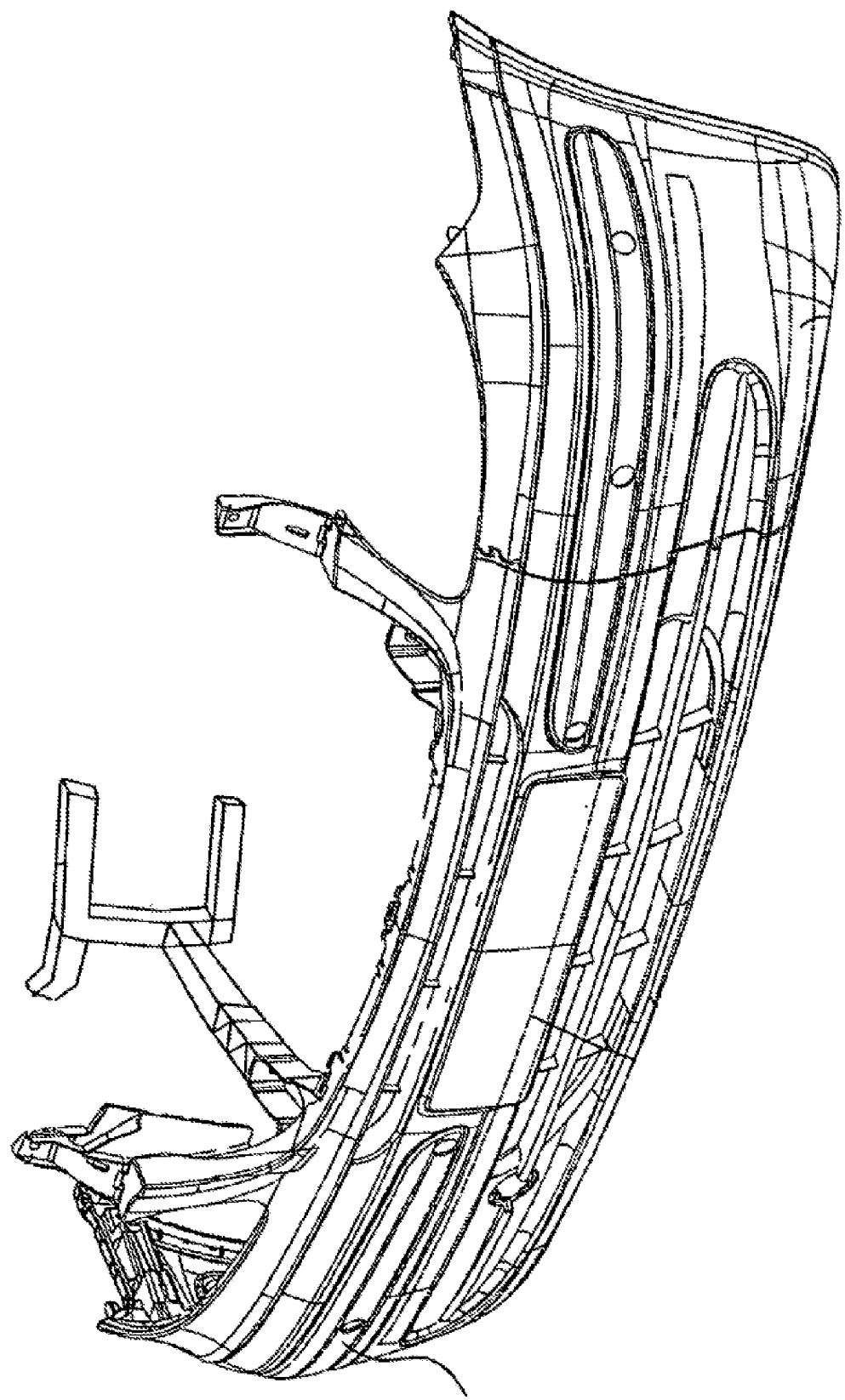
FIG. 4A is a front perspective view of an example of a bumper unit for a vehicle.
Figure 4B:
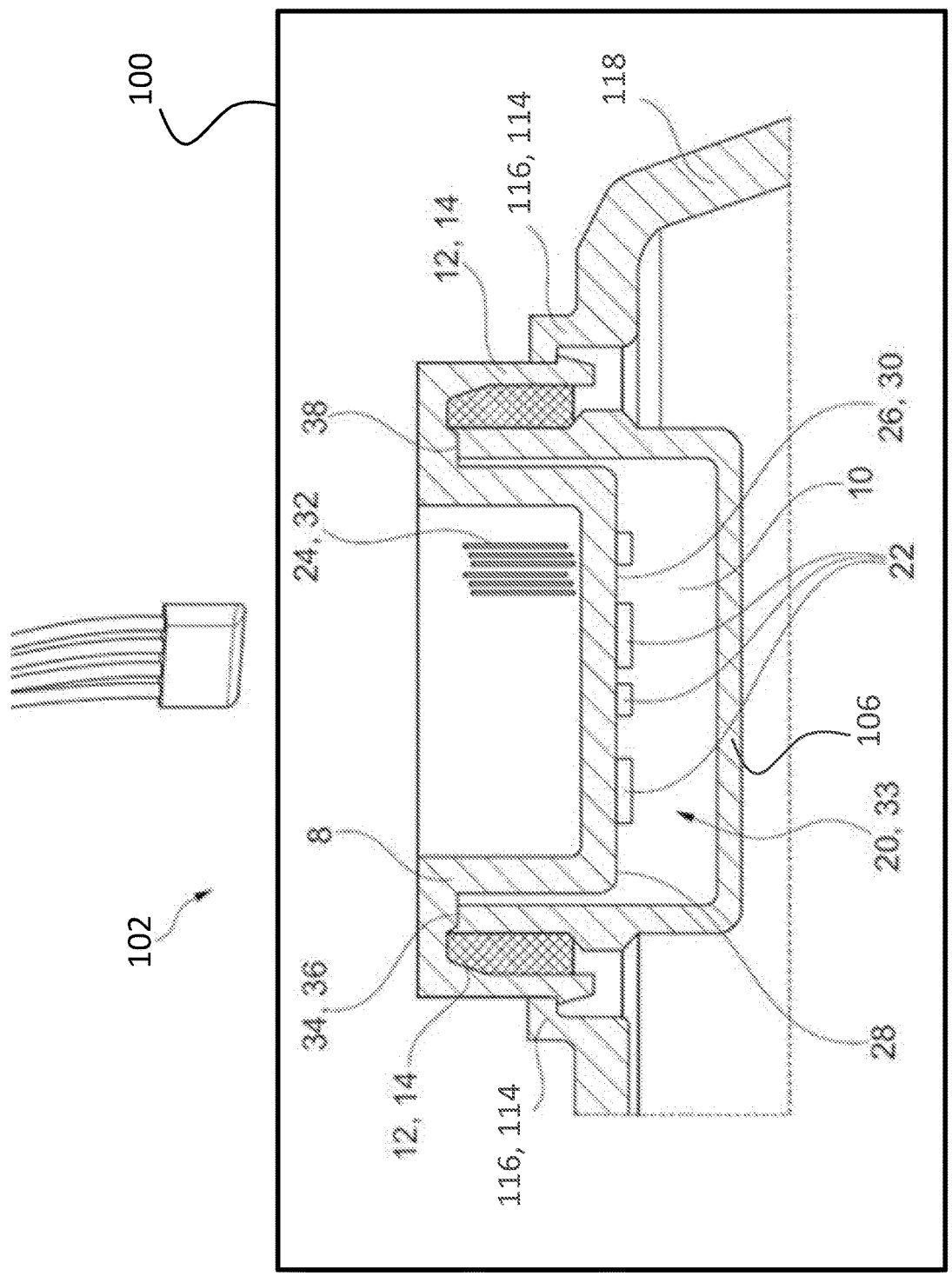
FIG. 4B is a schematic illustration of a bumper unit showing a sectional side view of an example of an electronic device.

FIG. 4A is a front perspective view of an example of a bumper unit 100 for a vehicle. FIG. 4B is a schematic illustration of a bumper unit 100 showing a sectional side view of an example of an electronic device.

Referring to FIGS. 4A and 4B, an electronic device 102 is provided as part of a bumper unit 100. For example, the electronic device 102 is attached to an inner side of the bumper unit 100. Similar to the electronic device 2 illustrated in FIG. 1A, the electronic device 102 includes an electronic module 20 having a conductor unit 22 and a contact means 24. The at least one conductor unit 22 is arranged on a surface of a cover piece 8 turned towards a cavity 10. Other components of the electronic device 102 which are formed by the cover piece 8 are the same as the electronic device 2 including the first retaining means 12 of the retaining unit 14, the edge section 34 which forms the end stop 36, the sealant 38, the carrier 26 formed by the functional surface 30 on the cover piece 8, and the conductors tracks 28 arranged on the functional surface 30.

As in other examples, the electronic module 20 includes a plurality of conductor units 22, forming a common control unit 33 for a plurality of electrical loads of the bumper unit 100. Here, the contact section 32 serves to connect the individual electrical loads to the common electronic module 20 and to establish a connection to a power source, which is for example arranged in the motor vehicle.

Still referring to FIG. 4B, the housing of the electronic device 102 is formed by the attachment of the cover piece 8 with the bumper unit 100. That is, rather than being attached to a floor piece 6 and a retaining plate 18 of a rear-view device as illustrated in FIG. 1A, the cover piece 8 may be attached to an inner side of the bumper unit 100. In one example, the cover piece is clipped onto a first surface 118 of the bumper unit 100 and a retaining means 116 of a second surface 114 of the bumper unit 100. The cover piece may be attached above a base surface 106 of the bumper unit 100. The first surface 118, second surface 114 with retaining means 116, and base surface 106 may all be integrally formed with the bumper unit 100 at an inner side for attaching the cover piece 8 and corresponding components and forming the electronic device 102.

Referring back to FIGS. 1B and 1C, it should be appreciated by a person of ordinary skill in the art that other attachment mechanisms can be used for attaching the cover piece 8 to the bumper unit 100, as previously described. That is, mating threaded surfaces or a bolt or screw fastener in conjunction with a threaded hole and a through hole.

Figure 5A:
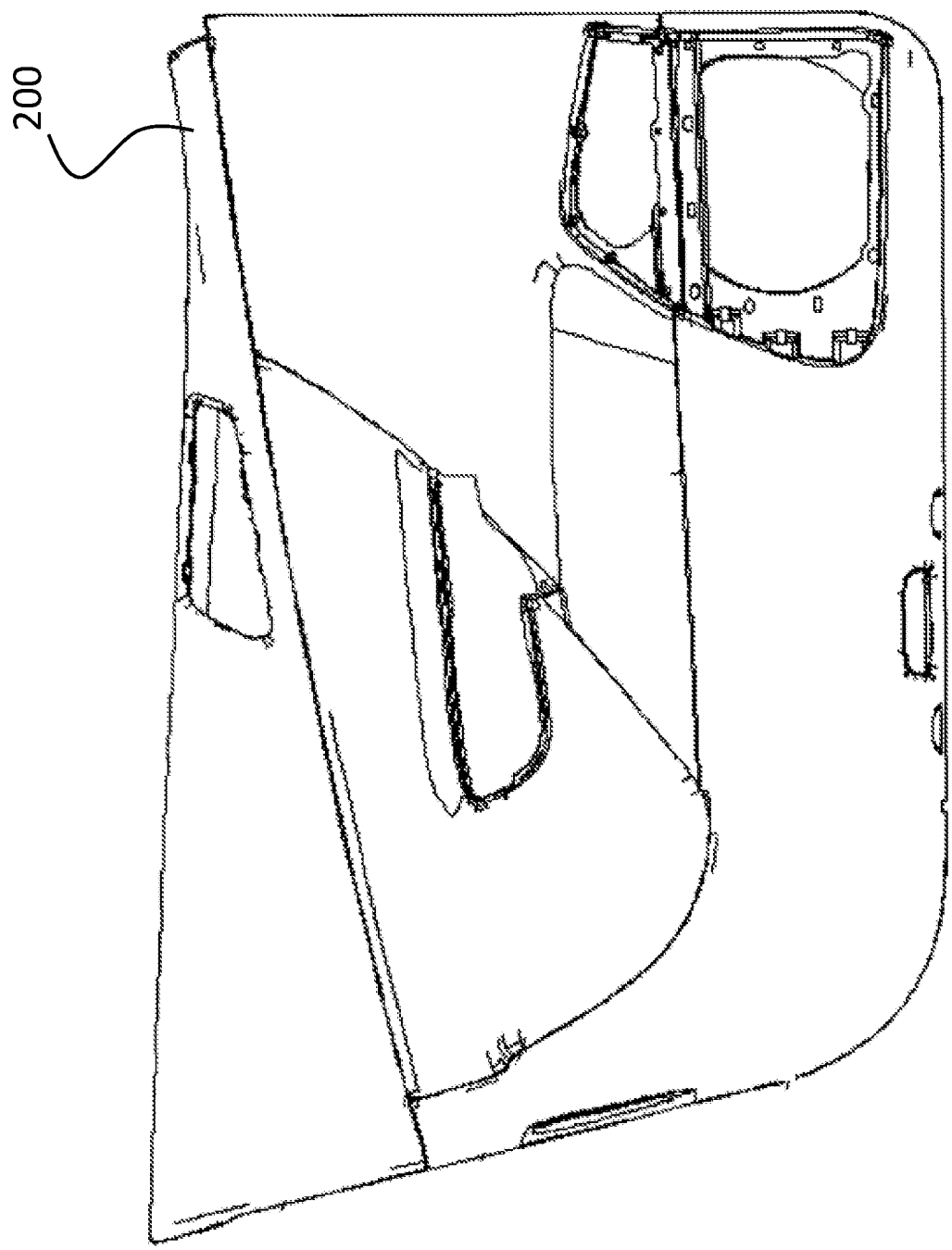
FIG. 5A is a front perspective view of an example of a door trim for a vehicle.
Figure 5B:
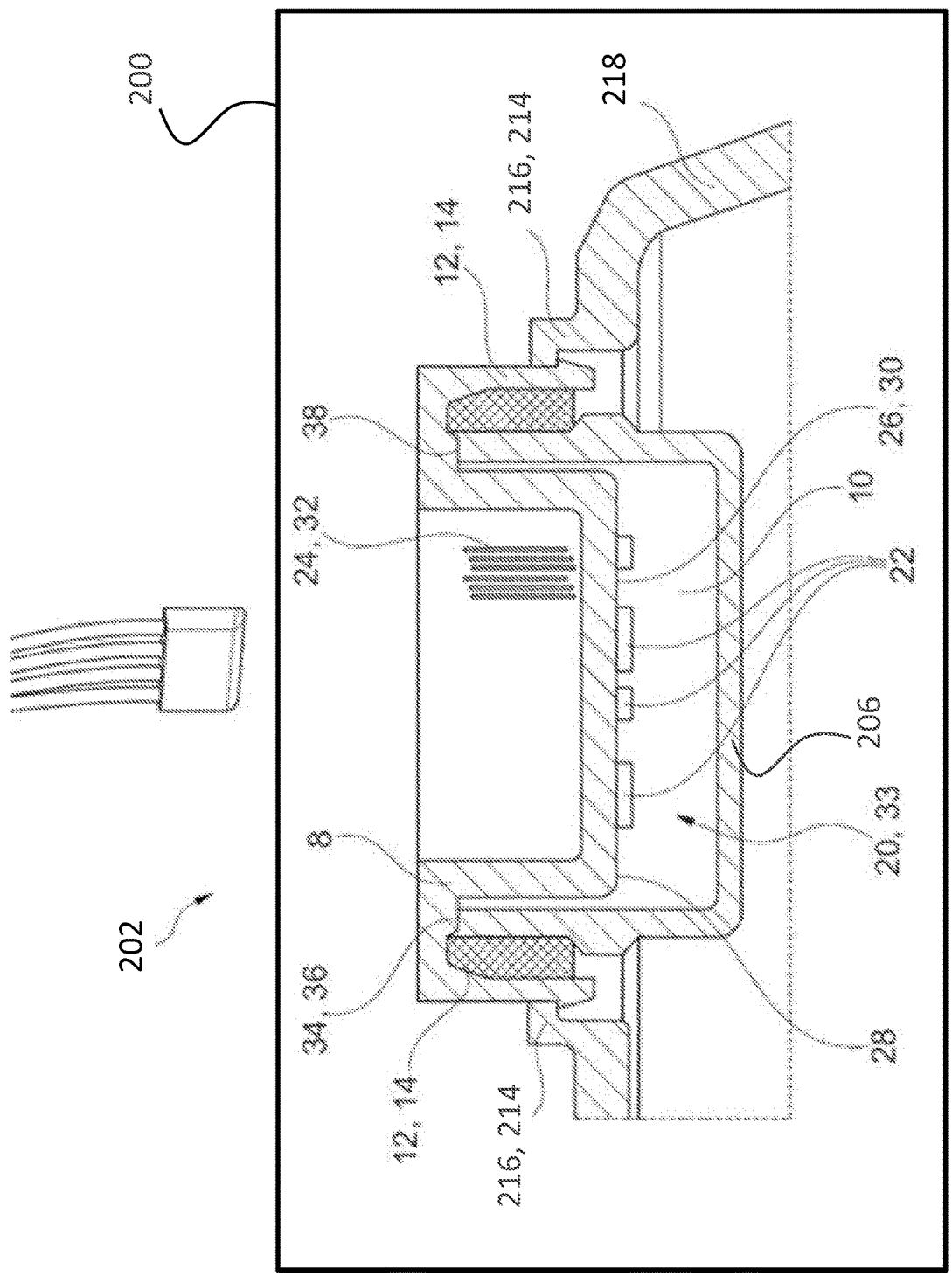
FIG. 5B is a schematic illustration of a door trim showing a sectional side view of an example of an electronic device.

FIG. 5A is a front perspective view of an example of a door trim for a vehicle. FIG. 5B is a schematic illustration of a door trim showing a sectional side view of an example of an electronic device.

Referring to FIGS. 5A and 5B, an electronic device 202 is provided as part of a door trim part 200. For example, the electronic device 202 is attached to an inner side of the door trim part 200. The electronic device 202 includes the cover piece 8 turned towards the cavity 10, the electronic module 20, conductor unit 22, contact means 24, first retaining means 12 of the retaining unit 14, the edge section 34 which forms the end stop 36, the sealant 38, the carrier 26 formed by the functional surface 30 on the cover piece 8, the conductors tracks 28 arranged on the functional surface 30, the common control unit 33 for a plurality of electrical loads of the door trim part 200, and a contact section 32 to connect the individual electrical loads to the common electronic module 20 and to establish a connection to a power source.

Still referring to FIG. 5B, the housing of the electronic device 202 is formed by the attachment of the cover piece 8 with the door trim part 200. That is, rather than being attached to a floor piece 6 and a retaining plate 18 of a rear-view device as illustrated in FIG. 1A, the cover piece 8 may be attached to an inner side of the door trim part 200. In one example, the cover piece is clipped onto a first surface 218 of the door trim part 200 and a retaining means 216 of a second surface 214 of the door trim part 200. The cover piece may be attached above a base surface 206 of the door trim part 200. The first surface 218, second surface 214 with retaining means 216, and base surface 206 may all be integrally formed with the door trim part 200 at an inner side for attaching the cover piece 8 and corresponding components and forming the electronic device 202.

Figure 6A:
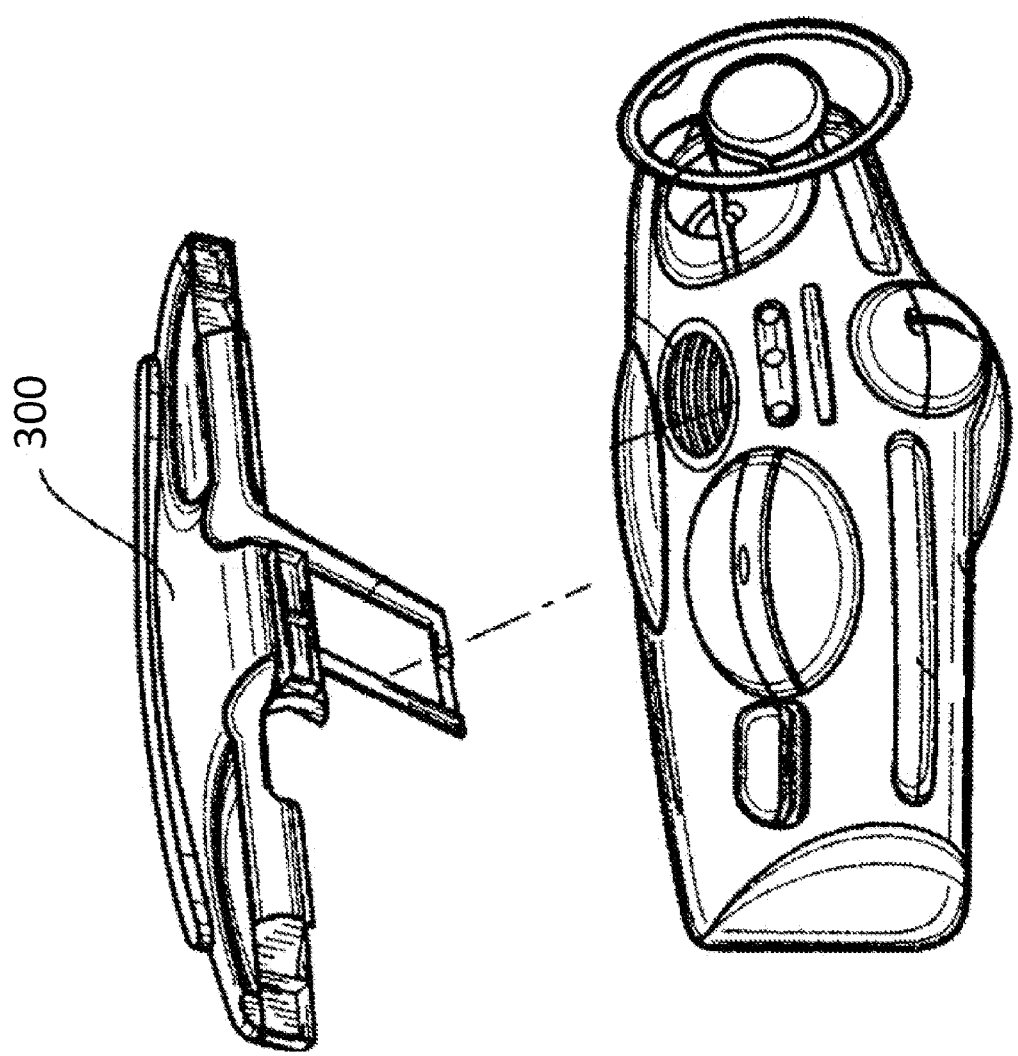
FIG. 6A is a front perspective view of an instrument panel retainer for a vehicle.
Figure 6B:
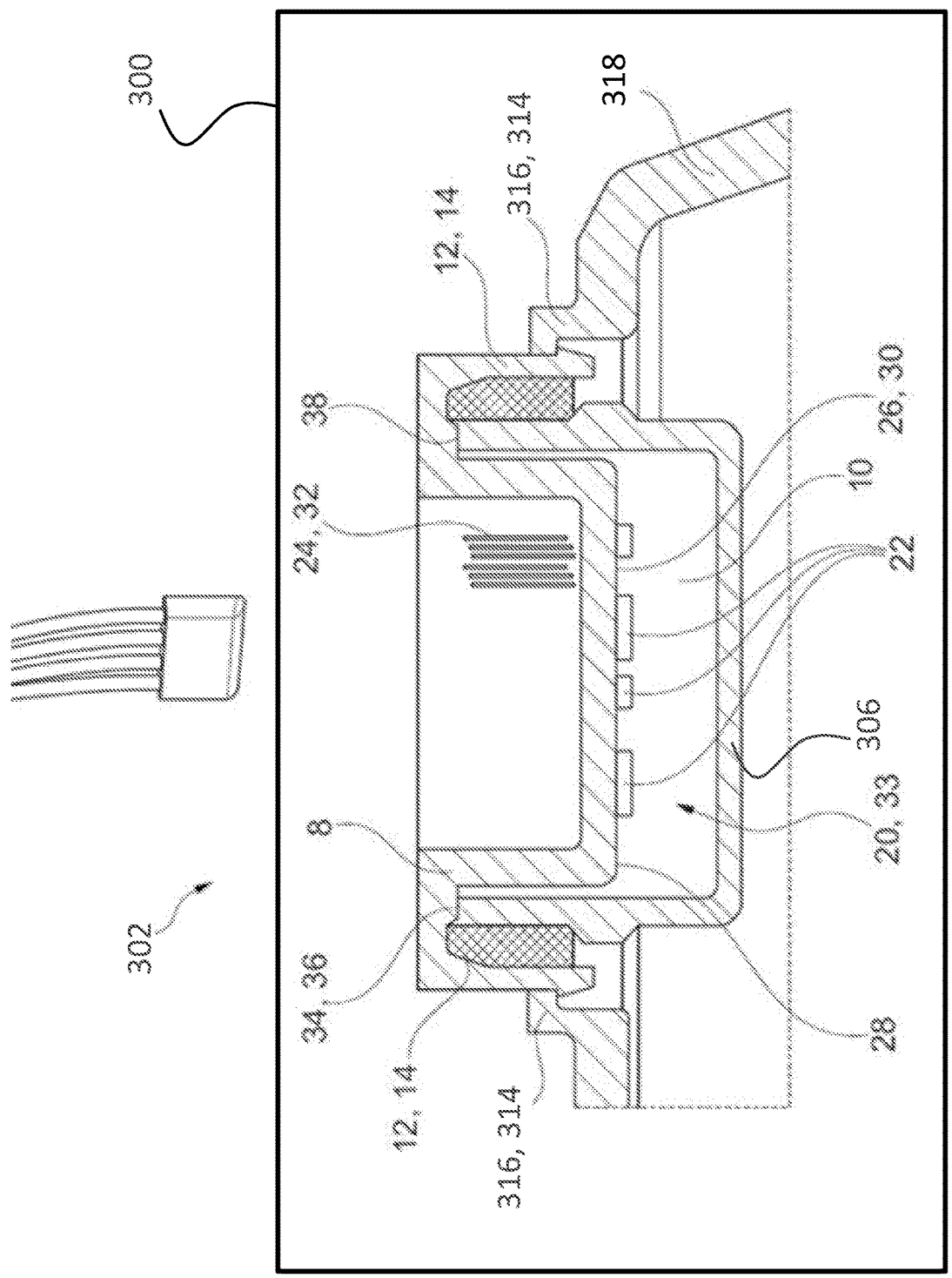
FIG. 6B is a schematic illustration of an instrument panel retainer showing a sectional side view of an example of an electronic device.

FIG. 6A is a front perspective view of an instrument panel retainer for a vehicle. FIG. 6B is a schematic illustration of an instrument panel retainer showing a sectional side view of an example of an electronic device.

Referring to FIGS. 6A and 6B, an electronic device 302 is provided as part of an instrument panel retainer 300. For example, the electronic device 302 is attached to an inner side of the instrument panel retainer 300. The electronic device 302 includes the cover piece 8 turned towards the cavity 10, the electronic module 20, conductor unit 22, contact means 24, first retaining means 12 of the retaining unit 14, the edge section 34 which forms the end stop 36, the sealant 38, the carrier 26 formed by the functional surface 30 on the cover piece 8, the conductors tracks 28 arranged on the functional surface 30, the common control unit 33 for a plurality of electrical loads of the instrument panel retainer 300, and a contact section 32 to connect the individual electrical loads to the common electronic module 20 and to establish a connection to a power source.

Still referring to FIG. 6B, the housing of the electronic device 302 is formed by the attachment of the cover piece 8 with the instrument panel retainer 300. That is, rather than being attached to a floor piece 6 and a retaining plate 18 of a rear-view device as illustrated in FIG. 1A, the cover piece 8 may be attached to an inner side of the instrument panel retainer 300. In one example, the cover piece is clipped onto a first surface 318 of the instrument panel retainer 300 and a retaining means 316 of a second surface 314 of the instrument panel retainer 300. The cover piece may be attached above a base surface 306 of the instrument panel retainer 300. The first surface 318, second surface 314 with retaining means 316, and base surface 306 may all be integrally formed with the instrument panel retainer 300 at an inner side for attaching the cover piece 8 and corresponding components and forming the electronic device 302.

Figure 7:
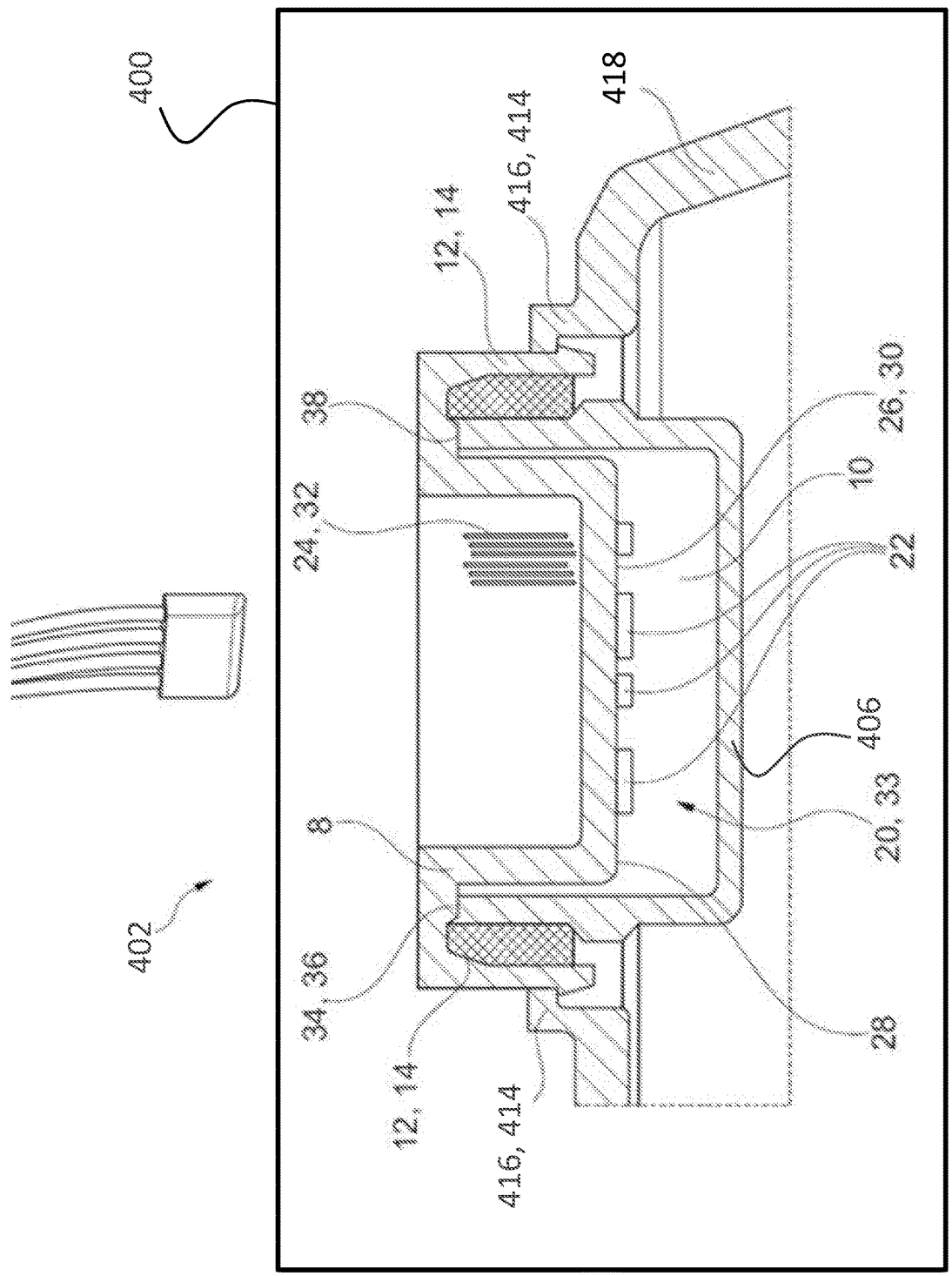
FIG. 7 is a schematic illustration of a center console showing a sectional side view of an example of an electronic device.

FIG. 7 is a schematic illustration of a center console showing a sectional side view of an example of an electronic device.

Referring to FIG. 7, an electronic device 402 is provided as part of a center console 400. For example, the electronic device 402 is attached to an inner side of the center console 400. The electronic device 402 includes the cover piece 8 turned towards the cavity 10, the electronic module 20, conductor unit 22, contact means 24, first retaining means 12 of the retaining unit 14, the edge section 34 which forms the end stop 36, the sealant 38, the carrier 26 formed by the functional surface 30 on the cover piece 8, the conductors tracks 28 arranged on the functional surface 30, the common control unit 33 for a plurality of electrical loads of the center console 400, and a contact section 32 to connect the individual electrical loads to the common electronic module 20 and to establish a connection to a power source.

The housing of the electronic device 402 is formed by the attachment of the cover piece 8 with the center console 400. That is, rather than being attached to a floor piece 6 and a retaining plate 18 of a rear-view device as illustrated in FIG. 1A, the cover piece 8 may be attached to an inner side of the center console 400. In one example, the cover piece is clipped onto a first surface 418 of the center console 400 and a retaining means 416 of a second surface 414 of the center console 400. The cover piece may be attached above a base surface 406 of the center console 400. The retaining section 418, retaining unit 414 with retaining means 416, and base surface 406 may all be integrally formed with the center console 400 at an inner side for attaching the cover piece 8 and corresponding components and forming the electronic device 402.

In all examples, base surface 106, 206, 306, 406 may be a floor surface of the respective vehicle part.

It will be appreciated by those skilled in the art that changes could be made to the embodiments described above without departing from the broad inventive concept thereof. It is understood, therefore, that the present disclosure disclosed herein is not limited to the particular embodiments disclosed, and it is intended to cover modifications within the spirit and scope of the present disclosure.

What is claimed is:

1. An electronic device of a vehicle part of a motor vehicle, comprising:
    at least one housing comprising at least one base surface of the vehicle part and a cover piece attached on the base surface, which in the attached state delimits an almost completely closed cavity;
    at least one first retaining means of a first surface of the vehicle part through which the housing is fixed in or on the vehicle part; and
    at least one electronic module comprising at least one conductor unit and at least one contact means connected with the conductor unit,
    wherein the at least one conductor unit is arranged on a surface of at least one of the base surface of the vehicle part and the cover piece which is turned towards the cavity, and comprises at least one carrier and at least one conductor track applied directly to the carrier, the contact means extends through at least one of the cover piece and the base surface of the vehicle part with at least one protruding contact section being accessible externally, the at least one carrier of the at least one conductor unit is formed at least in sections by a functional surface of at least one of the cover piece and the base surface of the vehicle part adjacent to the cavity and turned towards the cavity, and at least one of the cover piece and the base surface of the vehicle part with the at least one first retaining means of the first surface of the vehicle part form or forms a common component.

2. The electronic device according to claim 1, wherein the vehicle part comprises at least one of a bumper unit, a door trim part, an instrument panel retainer, and a center console.

3. The electronic device according to claim 1, wherein the at least one carrier is formed entirely by the functional surface of at least one of the base surface of the vehicle part and the cover piece.

4. The electronic device according to claim 1, wherein the conductor track applied directly to the carrier and the functional surface is applied by at least one of injection molding Molded Interconnect Devices (MID), a conductive foil Inmold-Labeling (IML), and Laser Direct Structuring (LDS) directly to the carrier and the functional surface.

5. The electronic device according to claim 1, wherein
the electronic module comprises a plurality of conductor units or the electronic module forms a common control unit for a plurality of electrical loads of the vehicle part, wherein each electrical load is or can be functionally assigned with at least one conductor unit, and
wherein at least one main conductor unit comprises a driver circuit via which the conductor units functionally assigned to the electrical loads are individually or jointly controllable.

6. The electronic device according to claim 1, wherein at least one of
the common component of the at least one first retaining means and of the cover piece or of the base surface of the vehicle part is an injection molded part, and
the cover piece with the at least one first retaining means of the first surface of the vehicle part is formed as a common component.

7. The electronic device according to claim 1, wherein at least one of
the housing is fixed by the first retaining means, detachably, by means of a rear grip in or on the vehicle part, and
the first retaining means comprises at least one of an externally threaded section on the cover piece or on the base surface of the vehicle part, a latching element, such as clips or a bayonet fitting, and a screw or bolt element.

8. The electronic device according to claim 7, wherein
the first retaining means is fixed with a first end to an end of the cover piece or the base surface of the vehicle part opposite of the functional surface of the cover piece or base surface and is arranged with a second end extending in the direction of the functional surface, and
wherein the first retaining means is designed to extend without overlapping to the plane of the functional surface and the second end has a distance from the plane of the functional surface.

9. The electronic device according to claim 7, wherein
the first surface of the vehicle part comprises a second retaining means fixed in or on the vehicle part, and
wherein the second retaining means comprises at least one of an internally threaded section which is able to interact with the first retaining means designed as externally threaded section, a rear-gripping receiving means interacting with the first retaining means designed as a latching element, and an accommodation for the first retaining means designed as a screw or bolt element.

10. The electronic device according to claim 1, wherein at least one of the at least one protruding and externally accessible contact section of the at least one contact means comprises at least one pin, in particular a plurality of pins, via which the electronic module can be or is connected with at least one of a power source and an electrical load, and
the electronic device comprises at least one energy storage arranged in the cavity of the housing device functional assigned to the electronic module for storing and releasing electrical energy.

11. The electronic device according to claim 1, wherein
the cover piece and the base surface of the vehicle part in each case comprise a cylindrical section, by which, in response to being joined, the cover piece and the base surface of the vehicle part can be slid into each other concentrically and telescopically, and
wherein the cover piece comprises an edge section protruding radially with regard to the cylindrical section and extending fully around the outer surface of the cover piece, which, in response to the cover piece and the base surface of the vehicle part being joined, forms an end stop.

12. The electronic device according to claim 10, wherein
at least one of the cover piece and the base piece has a pot-like design, and
wherein at least the cover piece comprises an extensive base plate adjacent to the cylindrical section, which runs transversally or inclined to the axis of the cylindrical section, and on its side turned towards the base surface of the vehicle part the functional surface is arranged and on its side turned away from the base surface of the vehicle part and surrounded by the cylindrical section the contact section of the contact means is arranged.

13. The electronic device according to claim 1, wherein at least one sealant is arranged between the cover piece and the base surface of the vehicle part between the base surface and an edge section of the cover piece through which the cavity of the housing can be sealed with respect to a gap existing between the cover piece and the base surface.

14. The electronic device according to claim 1, wherein the vehicle part includes a second surface and a second retaining means, the base surface of the housing comprising an element of a component configured as a one-piece injection molded part of at least one of the second surface and the second retaining means of the vehicle part.

15. The electronic device according to claim 1, wherein at least one of the base surface of the vehicle part, the cover piece, the first retaining means, and a second retaining means comprise a plastic.

16. The electronic device according to claim 1, wherein the electronic device is designed as a lighting module.

17. The electronic device according to claim 1, wherein the at least one base surface of the vehicle part comprises a floor surface of the vehicle part.

18. A bumper unit for a motor vehicle with at least one electronic device according to claim 1.

19. A door trim unit for a motor vehicle with at least one electronic device according to claim 1.

20. A instrument panel retainer for a motor vehicle with at least one electronic device according to claim 1.

21. A center console for a motor vehicle with at least one electronic device according to claim 1.

* * * * *